May 14, 1957 B. D. PEWITT 2,792,498
STABILIZED TWO-STAGE OSCILLATORS
Filed Aug. 21, 1953

INVENTOR.
Bion D. Pewitt

BY Charles H. Brown
ATTORNEY

United States Patent Office 2,792,498

Patented May 14, 1957

2,792,498

STABILIZED TWO-STAGE OSCILLATORS

Bion D. Pewitt, Haddon Heights, N. J., assignor to Radio Corporation of America, a corporation of Delaware Application August 21, 1953, Serial No. 375,588

10 Claims. (Cl. 250—36)

Figure 1:
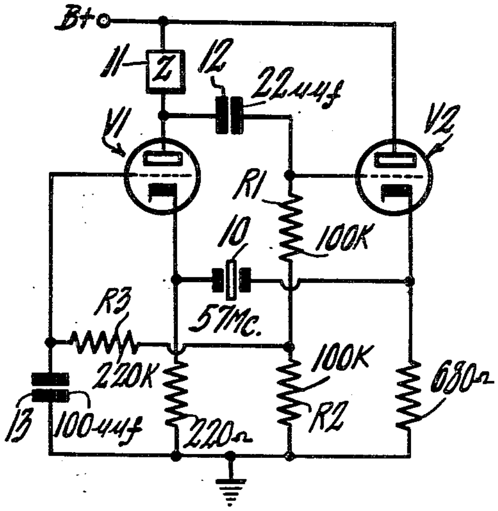

This invention relates to two stage oscillators, and more particularly, to such oscillators including means to maintain a suitably low operating dynamic gain while providing a high static gain to insure starting and operation under unfavorable conditions.

A two-stage oscillator comprises a first electron discharge device or vacuum tube circuit having an output electrode connected to an input electrode of a second electron discharge device or vacuum tube circuit. A portion of the output of the second vacuum tube circuit is fed back to an input electrode of the first vacuum tube circuit. Because of the 180 degree phase reversal in the second vacuum tube circuit, the energy fed back to the input of the first vacuum tube circuit is in the proper phase to maintain oscillations. The amplitude of the oscillations stablize at a value at which the gain around the loop is equal to unity.

If the amplitude of oscillations in the oscillator circuit is too great, a number of undesirable effects result. The output of the oscillator circuit may include an excessive amount of oscillations at frequencies which are harmonics of the desired fundamental frequency. The presence of the harmonic frequencies may be undesirable in itself, and the energy in the harmonic frequencies has a bad effect on the frequency stability of the oscillator. In the case of the oscillator circuits including a frequency determining piezo-electric crystal, the characteristics of the crystal are a function of the voltage applied thereto. For these and other reasons, the amplitude of oscillations in an oscillator circuit should be maintained at a reasonably low value taking into consideration the characteristics of the elements making up the oscillator circuit.

A two-stage oscillator can easily provide more amplification or gain around the loop than is necessary to maintain oscillations. In the past, this dynamic gain around the loop has been maintained at a suitably low level by means of negative self-bias developed at the grid of one of the tubes. However, it is found that when the static gain built into the circuit is such that the dynamic gain is suitably limited by this method, the static gain in the loop may be so low that the oscillator circuit cannot be depended upon to start and maintain oscillations under unfavorable conditions such as may result from changes in the supply voltages, changes in the vacuum tubes, changes in the loading of the oscillator by the utilization circuit, and changes in climatic conditions.

It is an object of this invention to provide an improved two-stage oscillator circuit characterized by improved frequency stability, the reduction of harmonic frequencies in the output, a stabilized output amplitude, generally improved reliability in the face of variations in supply voltages, tube parameters, tube ageing, loading, and climatic conditions.

In one aspect, the invention comprises a two-stage oscillator in which a gain-limiting negative self-bias is developed at the grid electrode of one of the tubes. A portion of the negative bias thus developed is applied to the grid electrode of the other tube in the oscillator. In this manner the dynamic gain or amplification in both tubes is appropriately limited. The static gain in the loop (at the instant of starting the oscillator or under unfavorable conditions) is very high because negative bias is not developed and applied to the two grids. By applying negative self-bias to the grids of both tubes, the circuit can be designed to have a much higher static gain to insure reliable starting, and the operating or dynamic gain can be independently adjusted to obtain the advantages of low operating level. The high static gain is then automatically available to compensate for unfavorable operating conditions such as changes in the line voltages, etc.

These and other objects and aspects of the invention will be apparent to those skilled in the art from the following more detailed description taken in conjunction with the drawings, wherein Figs. 1, 2, 3 and 4 show two-stage oscillators constructed according to the teachings of this invention.

Fig. 1 shows a two-stage crystal controlled oscillator including vacuum tubes V1 and V2. A frequency determining piezo-electric crystal 10 is connected between the cathodes of the two tubes. An LC circuit 11 connected to the plate of tube V1 selects the desired overtone of crystal 10 at which the oscillator will operate. In the lower frequency region, impedance 11 may be a resistor, in which case the circuit oscillates at the frequency determined by crystal 10, since in this case the crystal is the only frequency determining element in the circuit. Oscillations on the plate of tube V1 are applied thru coupling capacitor 12 to the grid of tube V2. These oscillations drive the grid of tube V2 positive for a portion of each cycle of the oscillations. When the grid is positive, current flows from ground thru grid bias resistors R2 and R1 to the grid of tube V2. This results in a voltage drop across resistors R2 and R1 which maintains the grid of tube V2 at a negative value limiting the dynamic gain or amplification therein.

That portion of the negative bias developed across resistor R2 is applied thru resistor R3 to the grid of tube V1. A capacitor 13 is connected from the grid of tube V1 to ground to connect the grid of tube V1 to ground so far as oscillations are concerned but to isolate the grid from ground so far as direct current is concerned. Resistor R3 and capacitor 13 constitute a filter which prevents radio frequency voltage on the grid of tube V2 from being applied to the grid of tube V1. By this construction, the dynamic gain of both of tubes V1 and V2 is appropriately limited. However, there is no sacrifice in non-oscillating loop gain since if there are no oscillations, there is no negative bias applied to either grid. In the prior art construction, wherein negative grid bias is developed only on the grid of tube V2, the circuit stabilizes with a loop gain of unity, and under this condition, tube V2 has very little of the total gain while tube V1 provides most of the gain in the loop. According to the teachings of this invention, the gain provided by the two tubes is more nearly equalized to provide the required total gain of unity.

Figure 2:
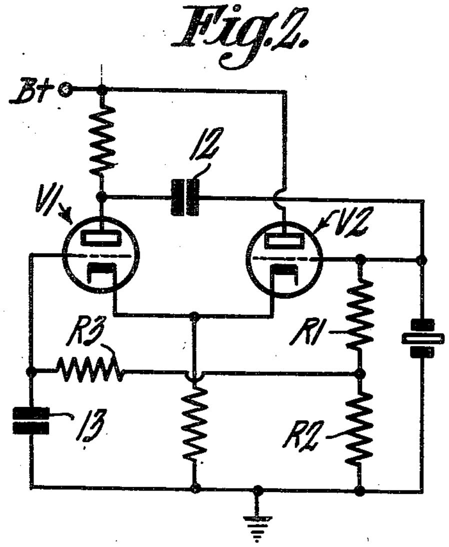
Figure 3:
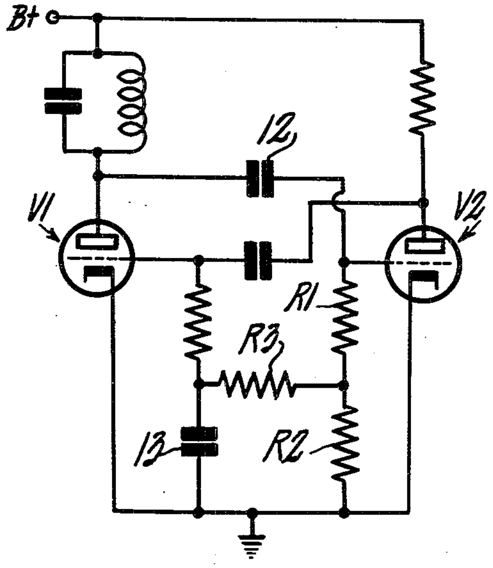
Figure 4:
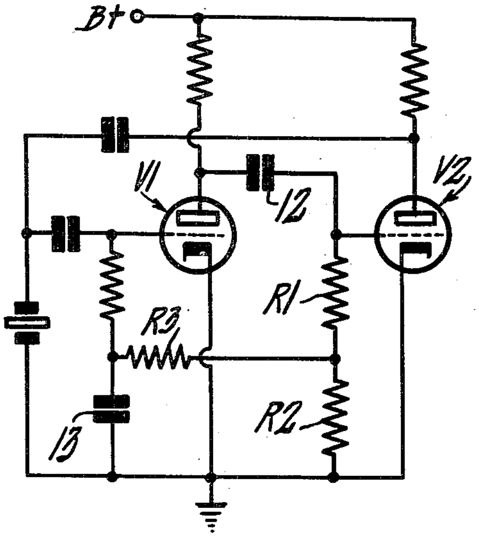

Figs. 2, 3 and 4 show different two-stage oscillator circuits, each including tubes V1 and V2. As in Fig. 1, coupling capacitors 12 couple the plate of tube V1 to the grid of tube V2. In each case, a tap between the grid bias resistors R1 and R2 in the grid circuit of tube V2 is connected thru a resistor R3 to the grid circuit of tube V1. A capacitor 13 together with resistor R3 provides a filter that allows direct current to be applied to the grid of tube V1 while preventing alternating current from going from the grid of tube V2 to the grid of tube V1. The oscillator circuits of Figs. 2, 3 and 4 operate as has been described in connection with Fig. 1 to more nearly equalize the dynamic gain in the two tubes V1 and V2.

In all of the oscillator circuits shown in the drawing, the smaller the ratio of resistor R1 compared with resistor R2, the more stable the operation of the oscillator, and at the same time the lower is the amplitude of the output oscillations from the oscillator circuit. Resistors R1 and R2 may be in the form of a potentiometer so that the tap may be adjusted to provide the degree of stabilization desired or, conversely, the degree of output amplitude desired. Fig. 1 includes the values of circuit components which were found to provide, by way of example, an overtone oscillator operative in a very stable manner.

What is claimed is:

1. A stabilized two-stage oscillator comprising, a first and a second vacuum tube each including cathode, grid, and plate electrodes, a regenerative loop including a coupling from the plate of said first tube to the grid of said second tube and a coupling from the plate of said second tube to the grid of said first tube, two grid bias resistors connected in series in the grid-cathode circuit of said second tube, a third resistor and a capacitor connected in series from the grid of said first tube to the cathode of said first tube, and a fourth resistor connecting the junction point between said two grid bias resistors to the junction between said third resistor and said capacitor, and said third resistor and said capacitor constituting a filter preventing the passage of alternating currents from the grid of said second tube to the grid of said first tube.

2. A stabilized two-stage oscillator as defined in claim 1, and in addition, a frequency determining piezo-electric crystal coupled between the grid and cathode of said first tube.

3. A stabilized two-stage sine wave oscillator comprising, first and second electron discharge devices including input and output electrodes, a regenerative oscillation amplifying loop including a coupling from an output electrode of said first device to an input electrode of said second device and a coupling from an output electrode of said second device to an input electrode of said first device, means coupled to the input electrode of said second device to develop a gain-limiting self bias voltage, and means coupled from said last named means to an input electrode of said first device to apply a portion of said bias voltage to said first device.

4. A stabilized two-stage sine wave oscillator comprising, first and second oscillation amplifying vacuum tubes each including grid-cathode input electrodes and plate-cathode output electrodes, a coupling from the output of the second tube to the input of the first tube, a capacitor coupling the plate of the first tube to the grid of the second tube, a resistor connecting the grid of the second tube to a point of reference potential, said capacitor and said resistor constituting a coupling from the output of said first tube to the input of said second tube and also having values to constitute an amplitude limiting grid leak self-bias system for said second tube, and resistor means connected from an intermediate point on said resistor to the grid of said first tube, whereby the dynamic gains in the two tubes are automatically limited.

5. A stabilized two-stage sine wave oscillator comprising, first and second oscillation amplifying vacuum tubes each having input and output electrodes including cathode, grid and plate electrodes, means providing a regenerative oscillation amplifying loop including a coupling from output electrodes of said first tube to input electrodes of said second tube and from output electrodes of said second tube to input electrodes of said first tube, a self-biasing grid resistor connected from the grid of said second tube to a point of reference potential to develop a negative bias voltage on said grid, and means coupled between an intermediate point on said resistor and the grid of said first tube to apply a portion of said negative bias voltage to the grid of said first tube.

6. A stabilized two-stage sine wave oscillator comprising, first and second vacuum tubes each having input and output electrodes including at least cathode, grid, and plate electrodes, means providing a regenerative loop including a coupling from the plate of said first tube to the grid of said second tube and a coupling from an output electrode of said second tube to an input electrode of said first tube, and means to limit the amplitude of oscillations in said tubes including two series connected self-biasing grid resistors connected from a point of reference potential to the grid of said second tube, and means coupling the direct current voltage at the junction between said two resistors to the grid of said first tube.

7. A stabilized cathode coupled two-stage sine wave oscillator circuit comprising, first and second vacuum tubes each including cathode, grid and plate electrodes, means providing a regenerative oscillation amplifying loop including a coupling from the cathode of said second tube to the cathode of said first tube, and means coupling the plate of said first tube to the grid of said second tube, two self-biased grid resistors connected in series from the grid of said second tube to a point of reference potential, and resistor means connected from the junction between said two grid bias resistors to the grid of said first tube.

8. A stabilized cathode coupled two-stage sine wave oscillator circuit comprising, first and second vacuum tubes each including cathode, grid and plate electrodes, means providing a regenerative oscillation amplifying loop including a coupling from the cathode of said second tube to the cathode of said first tube, and means coupling the plate of said first tube to the grid of said second tube, two self-biased grid resistors connected in series from the grid of said second tube to a point of reference potential, resistor means connected from the junction between said two grid bias resistors to the grid of said first tube, and a capacitor connected in the grid-cathode circuit of said first tube.

9. A stabilized cathode coupled two-stage oscillator circuit comprising, first and second vacuum tubes each including cathode, grid and plate electrodes, means providing a regenerative oscillation amplifying loop including a coupling from the cathode of said second tube to the cathode of said first tube, said coupling comprising a frequency determining piezo-electric crystal, means coupling the plate of said first tube to the grid of said second tube, two self-biased grid resistors connected in series from the grid of said second tube to a point of reference potential, and resistor means connected from the junction between said two grid bias resistors to the grid of said first tube.

10. A stabilized cathode coupled two-stage oscillator circuit comprising, first and second vacuum tubes each including cathode, grid and plate electrodes, means providing a regenerative oscillation amplifying loop including a coupling from the cathode of said second tube to the cathode of said first tube, means coupling the plate of said first tube to the grid of said second tube, a source of plate potential, a resonant circuit coupling the plate of said first tube to the positive terminal of said source, two self-biased grid resistors connected in series from the grid of said second tube to a point of reference potential, resistor means connected from the junction between said two grid bias resistors to the grid of said first tube, and a capacitor connected in the grid-cathode circuit of said first tube.

References Cited in the file of this patent

UNITED STATES PATENTS

| | | |
|---|---|---|
| 2,185,363 | White | Jan. 2, 1940 |
| 2,373,437 | Vanderlyn et al. | Apr. 10, 1945 |
| 2,598,516 | Dickinson | May 27, 1952 |

OTHER REFERENCES

Article: "Cathode Coupled Oscillators" by Butler, pp. 521–526 of "Wireless Engineer" for November 1944.